(12) United States Patent
Todorov et al.

(10) Patent No.: US 11,455,521 B2
(45) Date of Patent: Sep. 27, 2022

(54) NEUROMORPHIC DEVICE DRIVEN BY COPPER ION INTERCALATION

(71) Applicant: International Business Machines Corporation, Armonk, NY (US)

(72) Inventors: Teodor K. Todorov, Yorktown Heights, NY (US); Douglas M. Bishop, New York, NY (US); Jianshi Tang, Elmsford, NY (US); John Rozen, Hastings on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 866 days.

(21) Appl. No.: 16/290,585

(22) Filed: Mar. 1, 2019

(65) Prior Publication Data
US 2020/0279154 A1   Sep. 3, 2020

(51) Int. Cl.
*H01L 45/00*   (2006.01)
*G06N 3/063*   (2006.01)

(52) U.S. Cl.
CPC ....... *G06N 3/0635* (2013.01); *H01L 45/1206* (2013.01); *H01L 45/1253* (2013.01)

(58) Field of Classification Search
CPC .............. G06N 3/0635; H01L 45/1206; H01L 45/1253
USPC ....................................................... 429/220
See application file for complete search history.

(56) References Cited

U.S. PATENT DOCUMENTS

| | | | |
|---|---|---|---|
| 7,254,053 B2 | 8/2007 | Krieger et al. | |
| 8,368,285 B2 | 2/2013 | Chiang et al. | |
| 8,669,551 B2 * | 3/2014 | Kim | H01L 29/7869 257/43 |
| 9,721,653 B2 | 8/2017 | Yan et al. | |
| 10,566,427 B2 * | 2/2020 | Ahn | H01L 29/78 |
| 10,957,937 B2 * | 3/2021 | Todorov | H01L 45/1206 |
| 2018/0205011 A1 | 7/2018 | Brew et al. | |

FOREIGN PATENT DOCUMENTS

WO   2017091782 A1   6/2017

OTHER PUBLICATIONS

M. Arita et al., "Switching Operation and Degradation of Resistive Random Access Memory Composed of Tungsten Oxide and Copper Investigated Using In-Situ TEM," Scientific Reports, Nov. 27, 2017, 9 pages, vol. 5.
F. Xie et al., "Copper Atomic-Scale Transistors," Journal of Nanotechnology, Mar. 1, 2017, pp. 530-538, vol. 8.
W. Chen et al., "A CMOS-Compatible Electronic Synapse Device Based on Cu/SiO2/W Programmable Metallization Cells," Nanotechnology, Jun. 24, 2016, 13 pages, vol. 27, No. 25.
E.J. Fuller et al., "Li-ion Synaptic Transistor for Low Power Analog Computing," Advanced Materials, Jan. 2017, 33 pages, vol. 29, No. 4.

(Continued)

*Primary Examiner* — Son L Mai
(74) *Attorney, Agent, or Firm* — Randall Bluestone; Ryan, Mason & Lewis, LLP

(57) ABSTRACT

A neuromorphic semiconductor device includes a copper-based intercalation channel disposed on an insulative layer, a source contact and a drain contact of a substrate. A copper-based electrolyte layer is disposed on the copper-based intercalation channel and a copper-based gate electrode is disposed on the copper-based electrolyte layer.

20 Claims, 3 Drawing Sheets

(56) References Cited

OTHER PUBLICATIONS

T. Takahashi et al., "Solid-State Ionics: High Copper Ion Conductivity of the System CuCl-CuI-RbCl," Journal of Electrochemical Science and Technology, Oct. 1979, pp. 1654-1658, vol. 126, No. 10.

* cited by examiner

10

100

100

NEUROMORPHIC DEVICE DRIVEN BY COPPER ION INTERCALATION

BACKGROUND

In general, neuromorphic computing utilizes very-large-scale integration (VLSI) systems containing analog circuits to mimic neuro-biological architectures present in the nervous system. For example, arrays of trainable resistive devices, referred to as resistive processing units (RPUs), can be used to form artificial neural networks (ANNs), which perform machine learning to learn and implement algorithms.

Conventional RPU architecture includes a plurality of non-volatile resistive elements, such as phase change devices, each in series with a field-effect transistor (FET) connected in a diode configuration, that change their states after application of a certain voltage. For example, conventional RPU devices are implemented with resistive random access memory (RRAM), phase change memory (PCM), programmable metallization cell (PMC) memory, non-linear memristive systems, or any other two-terminal device that has non-linear resistive switching characteristics. However, fabricating RPU architectures in a semiconductor footprint using standard semiconductor fabrication procedures can present challenges.

SUMMARY

According to an exemplary embodiment of the present invention, a method for manufacturing a semiconductor device includes forming a copper-based intercalation channel on an insulative layer, a source contact and a drain contact of a substrate. The method further includes forming a copper-based electrolyte layer on the copper-based intercalation channel and forming a copper-based gate on the copper-based electrolyte layer.

According to an exemplary embodiment of the present invention, a semiconductor device includes a copper-based intercalation channel disposed on an insulative layer, a source contact and a drain contact of a substrate. A copper-based electrolyte layer is disposed on the copper-based intercalation channel and a copper-based gate is disposed on the copper-based electrolyte layer.

According to an exemplary embodiment of the present invention, a three-terminal solid-state copper-ion intercalation actuated analog switching device includes a source contact and a drain contact disposed on an insulative layer of a substrate. A copper-based intercalation channel is disposed on the insulative layer, the source contact, and the drain contact. The copper-based intercalation channel has variable resistivity as a function of copper content. A copper-based solid electrolyte is disposed on the copper-based intercalation channel. A copper-based gate electrode is disposed on the copper-based solid electrolyte layer. The copper-based gate electrode is configured to act as a copper ion reservoir for tuning the analog switching device via intercalation of the copper-based intercalation channel.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1:
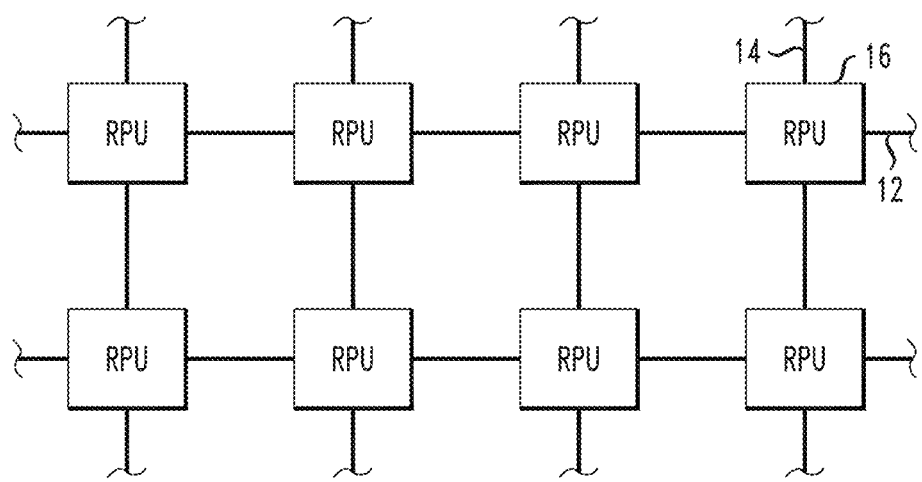
FIG. 1 is a block diagram illustrating an example RPU array, according to an embodiment of the invention.

Exemplary embodiments of the invention will now be discussed in further detail with regard to semiconductor devices and methods of manufacturing same and, in particular, to the formation of a neuromorphic device driven by copper ion intercalation.

It is to be understood that the various layers and/or regions shown in the accompanying drawings are not drawn to scale, and that one or more layers and/or regions of a type commonly used in, for example, complementary metal-oxide semiconductor (CMOS), field-effect transistor (FET), nanowire FET, nanosheet FET, fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FETs, CMOSs, MOSFETs, nanowire FETs, nanosheet FETs and/or FinFETs. By way of non-limiting example, the semiconductor devices can include, but are not limited to FET, CMOS, MOSFET, nanowire FET, nanosheet FET and FinFET devices, and/or semiconductor devices that use FET, CMOS, MOSFET, nanowire FET, nanosheet FET and/or FinFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

In an example RPU array 10, as illustrated in FIG. 1, the intersections between a set of row wires 12 and a set of column wires 14 are separated by RPUs 16, which are resistive elements each having an updateable resistive weight. Input voltages are respectively applied to the row wires 12, and each column wire 14 sums currents generated by each RPU 16 along a particular column wire 14. In a forward pass operation, forward matrix multiplication of the array 10 is computed by multiplying values stored in the RPUs 16 by the row wire voltage inputs. In a backward pass operation, backward matrix multiplication of the array is computed by voltages are applied at respective voltages to the column wires 14 instead of the row wires 12, reading current from the row wires 12.

Embodiments of the present invention relate to the use of copper ion intercalation to form a switching device that may be used, for example, in neuromorphic or analog semiconductor devices such as, e.g., an RPU.

More specifically, in accordance with an embodiment of the present invention, a three-terminal solid-state copper-ion intercalation actuated analog switching device is disclosed which comprises a copper-based intercalation layer, a solid copper-based electrolyte layer, and a copper-based gate electrode. The switching device provides neuromorphic capabilities in a semiconductor footprint that also allows the read and write functionality to be decoupled. For example, in contrast to two-terminal devices where both read and write operations are executed through the same two terminals, the three terminal configuration allows for a use of a third terminal (e.g., a "gate" terminal analogous to a transistor gate) which may support separate read and write functionality. For example, a read operation may utilize the first and third terminals while a write operation may utilize the second and third terminals, thereby decoupling the read functionality from the write functionality. The copper-based intercalation channel also has variable resistivity as a function of copper content that may be tuned via copper ion intercalation of copper ions from the copper-based gate electrode via the solid copper-based electrolyte layer in response to the application of a voltage. This tuning may be utilized, for example, to implement the neuromorphic functionality of a neural network such as that performed by RPUs, as described above.

Figure 2:
FIG. 2 is a schematic cross-sectional view illustrating manufacturing of a semiconductor device and showing a semiconductor substrate, according to an embodiment of the invention.

FIG. 2 is a schematic cross-sectional view of a semiconductor device 100 at an intermediate stage of fabrication according to an embodiment of the invention. In some embodiments, a semiconductor substrate 102 includes semiconductor material including, but not limited to, silicon (Si), silicon germanium (SiGe), silicon carbide (SiC), carbon doped silicon (Si:C), silicon germanium carbide (SiGeC), carbon doped silicon germanium (SiGe:C), a group III-V, II-VI compound semiconductor material or other semiconductor material. In addition, multiple layers of the semiconductor materials can be used as the semiconductor material of the substrate. The semiconductor substrate 102 can be a bulk substrate or a semiconductor-on-insulator substrate such as, but not limited to, a silicon-on-insulator (SOI), silicon-germanium-on-insulator (SGOI) or group III-V-on-insulator substrate including a buried insulating layer, such as, for example, a buried oxide, nitride layer or aluminum oxide.

Figure 3:
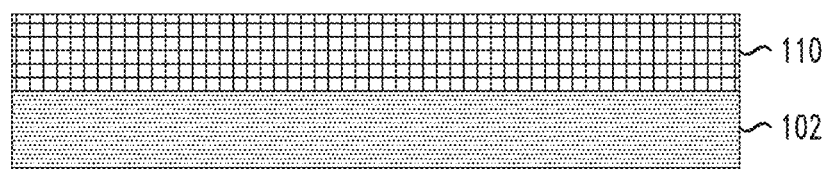
FIG. 3 is a schematic cross-sectional view illustrating manufacturing of a semiconductor device and showing formation of an insulative layer, according to an embodiment of the invention.

FIG. 3 is a schematic cross-sectional view illustrating manufacturing of a semiconductor device at an intermediate stage of fabrication after the formation of an insulative layer 110, according to an embodiment of the invention. The insulative layer 110 is formed on the substrate 102, for example, using known methods. For example, insulative layer 110 may be formed by coating substrate 102 with a silicon nitride material such as, e.g., $Si_3N_4$. For example, in an embodiment, a 100 nm layer of the silicon nitride material may be coated on substrate 102 to form insulative layer 110. In some embodiments, for example, the insulative layer may be formed through deposition methods including but not limited to sputtering, e-beam evaporation, thermal evaporation, chemical vapor deposition or atomic layer deposition. Alternative insulating or poorly conducting layers can be used such as, but not limited to, $SiO_2$ produced by thermal oxidation or TaN deposited by sputtering or other deposition techniques.

Figure 4:
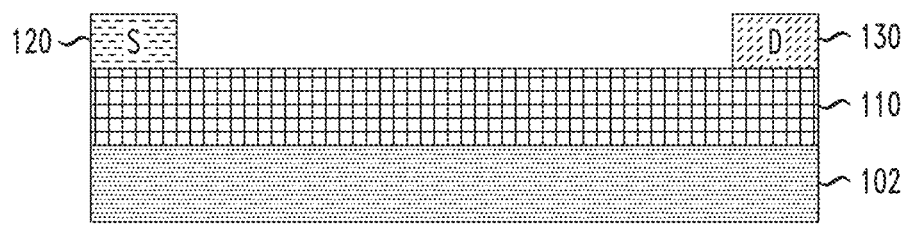
FIG. 4 is a schematic cross-sectional view illustrating manufacturing of a semiconductor device and showing formation of a source contact and a drain contact, according to an embodiment of the invention.

FIG. 4 is a schematic cross-sectional view illustrating manufacturing of a semiconductor device at an intermediate stage of fabrication after the formation of a source contact 120 and a drain contact 130, according to an embodiment of the invention. The source contact 120 and the drain contact 130 are formed on the insulative layer 110, for example, using known methods. In some embodiments source contact 120 and drain contact 130 may be evaporated by an e-beam technique. In some embodiments masking may be used with lithographic techniques to form the source contact 120 and drain contact 130 at desired locations. In some embodiments, suitable materials for the source contact 120 and the drain contact 130 include, but are not limited to, contact metals such as gold (Au), silver (Ag), platinum (Pt), palladium (Pd), titanium (Ti), nickel (Ni) and/or copper (Cu). In some embodiments, the source and drain contacts may comprise 5 A Ti and 50 A Pt, respectively.

In some embodiments, the source contact 120 and the drain contact 130 are formed using an evaporation process such as electron-beam (e-beam) evaporation. Advantageously, the evaporation can be performed through a mask to form the source contact 120 and drain contact 130 on opposite ends of the insulative layer 110 as shown in FIG. 4.

In some embodiments, source contact 120 and drain contact 130 may be formed by bottom-up epitaxial growth processes, wherein the source contact 120 and drain contact 130 are grown to a certain height (thickness) such as, but not necessarily limited to about 10 nm to about 50 nm. The epitaxially grown source contact 120 and drain contact 130 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1\times10^{18}/cm^3$ to $1\times10^{21}/cm^3$.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), metal-organic chemical vapor deposition (MOCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the source and drain contacts. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 5:
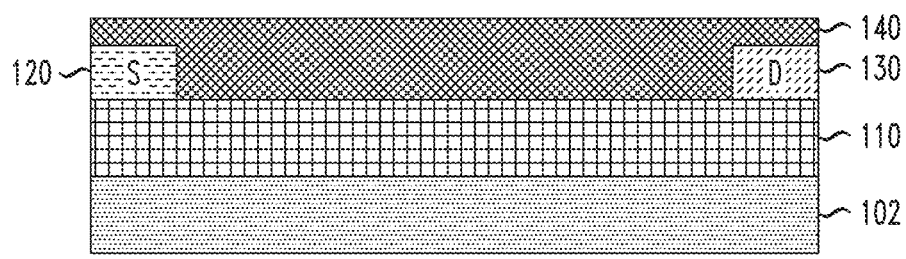
FIG. 5 is a schematic cross-sectional view illustrating manufacturing of a semiconductor device and showing formation of a copper-based intercalation channel, according to an embodiment of the invention.

FIG. 5 is a schematic cross-sectional view illustrating manufacturing of a semiconductor device at an intermediate stage of fabrication after the formation of a copper-based intercalation channel 140, according to an embodiment of the invention. The copper-based intercalation channel 140 is formed on the insulative layer 110, the source contact 120 and the drain contact 130, and extends between the source contact 120 and drain contact 130. In some embodiments, for example, copper-based intercalation channel 140 is formed of a copper-based material, $CuX_n$. The copper-based material may comprise, for example, at least one of a copper oxide material, a copper sulfide material, a copper selenide material, a copper telluride material and a molybdenum sulfide material where $0<n<1$. Other copper-based materials or materials capable of intercalating copper ions may alternatively be used.

In some embodiments, copper-based intercalation channel 140 may be formed by, for example, thermal oxidation of a copper layer deposited on the insulative layer 110. In some embodiments, copper-based intercalation channel 140 may be formed using other deposition techniques including, but not limited to, thermal evaporation, CVD, PECVD, RFCVD, PVD, ALD, MBD, PLD, and/or LSMCD, sputtering, and/or plating. In some embodiments masking may be used with lithographic techniques to form the copper-based intercalation channel 140 at desired locations.

Figure 6:
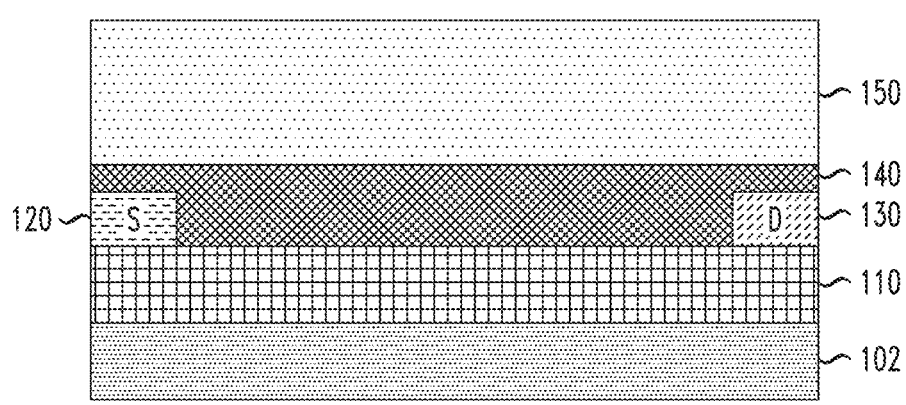
FIG. 6 is a schematic cross-sectional view illustrating manufacturing of a semiconductor device and showing formation of a copper-based electrolyte layer, according to an embodiment of the invention.

FIG. 6 is a schematic cross-sectional view illustrating manufacturing of a semiconductor device at an intermediate stage of fabrication after the formation of a copper-based electrolyte layer 150, according to an embodiment of the invention. The copper-based electrolyte layer 150 is formed on the copper-based intercalation channel 140, for example, using known methods. For example, in some embodiments, copper-based electrolyte layer 150 may be formed through thermal evaporation. In some embodiments, copper-based electrolyte layer 150 may be formed using other deposition techniques including, but not limited to, thermal evaporation, CVD, PECVD, RFCVD, PVD, ALD, MBD, PLD, and/or LSMCD, sputtering, and/or plating. In some embodiments masking may be used with lithographic techniques to form the copper-based electrolyte layer 150 at desired locations.

In some embodiments, copper-based electrolyte layer 150 may comprise a copper-rubidium-chloride-iodide material such as, e.g., $Cu_{16}Rb_4Cl_{13}I_7$. Other copper-based materials may also or alternatively be used. In some embodiments, the copper-based electrolyte layer 150 is formed of a solid material.

Figure 7:
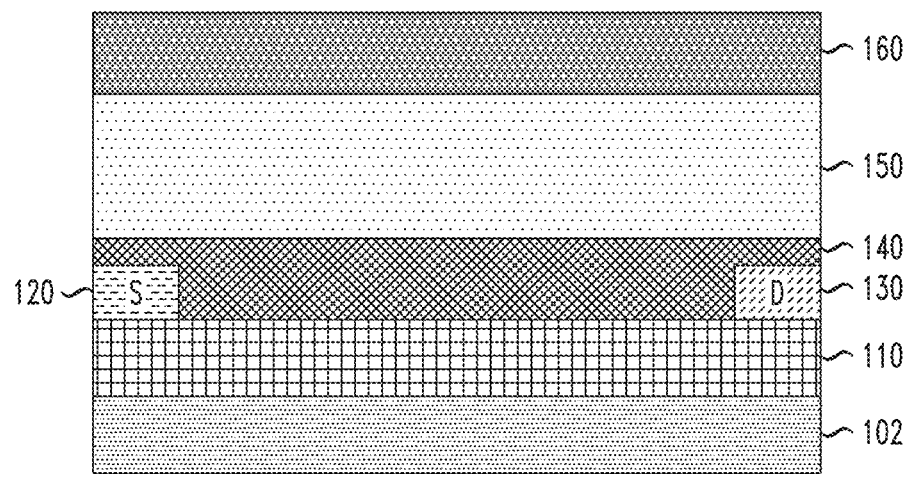
FIG. 7 is a schematic cross-sectional view illustrating manufacturing of a semiconductor device and showing formation of a copper-based gate electrode, according to an embodiment of the invention.

FIG. 7 is a schematic cross-sectional view illustrating manufacturing of a semiconductor device at an intermediate stage of fabrication after the formation of a copper-based gate electrode 160, according to an embodiment of the invention. The copper-based gate electrode 160 is formed on the copper-based electrolyte layer 150, for example, using known methods. For example, in some embodiments, copper-based gate electrode 160 may be formed through thermal evaporation. In some embodiments, copper-based gate electrode 160 may be formed using, for example, deposition techniques including, but not limited to, CVD, PECVD, RFCVD, PVD, ALD, MBD, PLD, and/or LSMCD, sputtering, and/or plating. In some embodiments, etching, planarization (e.g., CMP) or other similar techniques may be used to obtain a desired thickness of the copper-based gate electrode 160. In some embodiments masking may be used with lithographic techniques to form the copper-based gate electrode 160 at desired locations.

In some embodiments, copper-based gate electrode 160 may comprise pure copper or substantially pure copper. In some embodiments, copper-based gate electrode 160 may comprise the same material as copper-based intercalation channel 140, as described above. Other copper-based materials may also or alternatively be used.

In some embodiments, copper-based gate electrode 160 functions as both a gate electrode and a copper ion reservoir where, for example, copper ions may be transferred between copper-based gate electrode 160 and copper-based intercalation channel 140 via copper-based electrolyte layer 150 to tune the resistance of copper-based intercalation channel 140.

Figure 8:
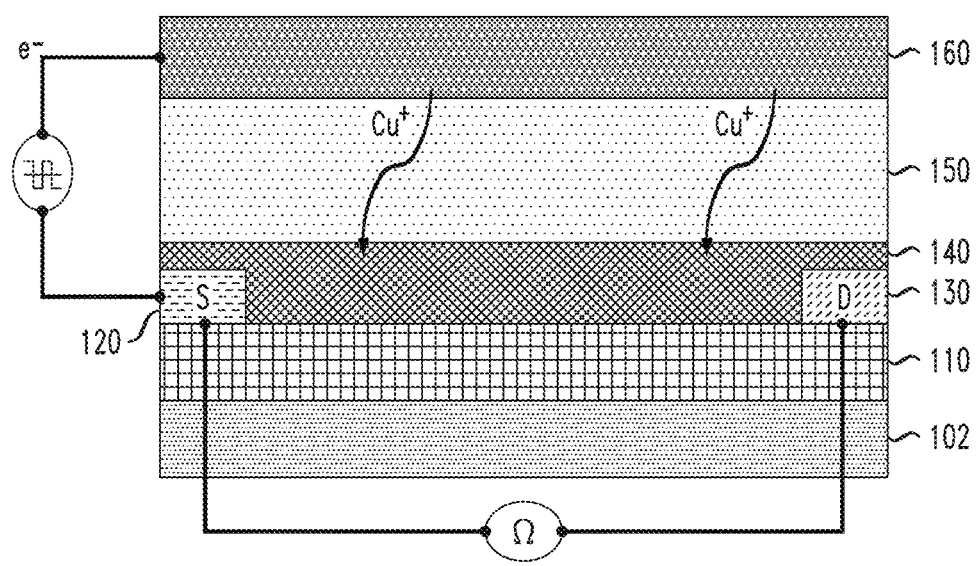
FIG. 8 is a schematic cross-sectional view illustrating the transfer of copper ions from a copper-based gate electrode to a copper-based intercalation channel of a semiconductor device, according to an embodiment of the invention.

With reference now to FIG. 8, during operation of semiconductor device 100, a voltage (e.g., between 0-5V in some embodiments) is applied between the copper-based gate electrode 160 and source/drain contacts of the semiconductor device such that copper ions are reversibly transferred between copper-based gate electrode 160 and copper-based intercalation channel 140 via copper-based electrolyte layer 150 using intercalation to vary the copper content of the copper-based intercalation channel. As the copper content of the copper-based intercalation channel is varied, the resistance of the copper-based intercalation channel is also varied which changes the resistance between the source contact 120 and the drain contact 130 and thus tunes the read or write resistance of the semiconductor device.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

The invention claimed is:

1. A method of manufacturing a semiconductor device, comprising:
    forming a copper-based intercalation channel on an insulative layer, a source contact and a drain contact of a substrate;
    forming a copper-based electrolyte layer on the copper-based intercalation channel; and
    forming a copper-based gate electrode on the copper-based electrolyte layer.

2. The method of claim 1, wherein the copper-based intercalation channel comprises at least one of a copper oxide material, a copper sulfide material, a molybdenum sulfide material, a copper selenide material and a copper telluride material.

3. The method of claim 1, wherein the copper-based electrolyte layer comprises a copper-rubidium-chlorine-iodine material.

4. The method of claim 3, wherein the copper-rubidium-chlorine-iodine material is $Cu_{16}Rb_4Cl_{13}I_7$.

5. The method of claim 1, wherein the copper-based electrolyte layer is a solid electrolyte.

6. The method of claim 1, wherein the copper-based intercalation channel comprises the same material as the copper-based gate electrode.

7. The method of claim 1, wherein the copper-based intercalation channel, the copper-based electrolyte layer, and the copper-based gate electrode are configured to transfer copper ions therebetween to tune the semiconductor device.

8. The method of claim 7, wherein the copper-based intercalation channel has a variable resistivity as a function of copper content.

9. The method of claim 1, wherein the insulative layer comprises a silicon-based material.

10. A semiconductor device, comprising:
    a copper-based intercalation channel disposed on an insulative layer, a source contact and a drain contact of a substrate;
    a copper-based electrolyte layer disposed on the copper-based intercalation channel; and
    a copper-based gate electrode disposed on the copper-based electrolyte layer.

11. The semiconductor device of claim 10, wherein the copper-based intercalation channel comprises at least one of copper oxide material, a copper sulfide material, a molybdenum sulfide material, a copper selenide material and a copper telluride material.

12. The semiconductor device of claim 10, wherein the copper-based electrolyte layer comprises a copper-rubidium-chlorine-iodine material.

13. The semiconductor device of claim 12, wherein the copper-rubidium-chlorine-iodine material is $Cu_{16}Rb_4Cl_{13}I_7$.

14. The semiconductor of claim 10, wherein the copper-based electrolyte layer is a solid electrolyte.

15. The semiconductor device of claim 10, wherein the copper-based intercalation channel comprises the same material as the copper-based gate electrode.

16. The semiconductor device of claim 10, wherein the copper-based intercalation channel, the copper-based electrolyte layer, and the copper-based gate electrode are configured to transfer copper ions therebetween to tune the semiconductor device.

17. The semiconductor device of claim 16, wherein the copper-based intercalation channel has a variable resistivity as a function of copper content.

18. The semiconductor device of claim 10, wherein the insulative layer comprises a silicon-based material.

19. An analog switching device, comprising:
    a source contact and a drain contact disposed on an insulative layer of a substrate;
    a copper-based intercalation channel disposed on the insulative layer, the source contact and the drain contact, the copper-based intercalation channel having variable resistivity as a function of copper content;
    a copper-based solid electrolyte disposed on the copper-based intercalation channel; and
    a copper-based gate electrode disposed on the copper-based solid electrolyte layer, the copper-based gate electrode configured to act as a copper ion reservoir for tuning the analog switching device via intercalation of the copper-based intercalation channel.

20. The analog switching device of claim 19,
wherein the copper-based intercalation channel, the copper-based solid electrolyte layer, and the copper-based gate electrode are configured to transfer copper ions therebetween to tune the analog switching device; and
wherein the copper-based intercalation channel has a variable resistivity as a function of copper content.

* * * * *